United States Patent [19]

Dykstra et al.

[11] Patent Number: 4,943,728
[45] Date of Patent: Jul. 24, 1990

[54] BEAM PATTERN CONTROL SYSTEM FOR AN ION IMPLANTER

[75] Inventors: Jerald P. Dykstra; Andrew M. Ray, both of Austin, Tex.

[73] Assignee: Eaton Corporation, Cleveland, Ohio

[21] Appl. No.: 317,225

[22] Filed: Feb. 28, 1989

[51] Int. Cl.$^5$ ............................................. H01J 37/317
[52] U.S. Cl. ................................................. 250/492.3
[58] Field of Search ....................... 250/492.21, 492.22

[56] References Cited

U.S. PATENT DOCUMENTS

| | | | |
|---|---|---|---|
| 4,118,630 | 10/1978 | McKenna et al. | 250/492.21 |
| 4,745,287 | 5/1988 | Turner | 250/492.2 |
| 4,794,305 | 12/1988 | Matsukawa | 315/111.81 |
| 4,804,852 | 2/1989 | Rose et al. | 250/492.21 |

FOREIGN PATENT DOCUMENTS 68-281248 12/1987 Japan .

OTHER PUBLICATIONS

Improved VLSI Device Yields Through Control of Implant Angle by R. E. Kaim and J. F. M. Westendorp.
Analysis of Uniformity of Trench Side-Wall Doping By Sims by T. Takemoto, Y. Hirofuji, H. Iwasaki, N. Matsuo.
A New Isolation Method With Boron-Implanted Sidewalls For Controlling Narrow-Width Effect by G. Fuse, M. Fukumoto, A. Shinohara, S. Odanaka, M. Sasago, T. Ohzone.
The Application Of Self-Spinning Ion Implantation To VLSI Devices, Nissin Electric Company, Ltd.
New End Station For Rotation/Wide-Angle Ion Implanter Technique And Its Application To VLSI Devices, Nissin Electric Company, Ltd.

Primary Examiner—Janice A. Howell
Assistant Examiner—Kiet T. Nguyen
Attorney, Agent, or Firm—F. M. Sajovec

[57] ABSTRACT

A defining aperture for an ion implanter in which wafers are implanted at high tilt angles, which aperture is configured to project a substantially circular beam pattern on the surface of the tilted wafer. One embodiment includes one or more movable aperture plates having elliptical apertures formed therein operating in conjunction with a fixed aperture plate having a circular aperture. Other embodiments include movable elliptical apertures, and a circular aperture rotatable about an axis perpendicular to the tilt axis of the wafer. Where an electron flood ring is used, one or more movable rings having elliptical apertures opening can be used.

12 Claims, 5 Drawing Sheets

BEAM PATTERN CONTROL SYSTEM FOR AN ION IMPLANTER

The present invention relates generally to ion implantation equipment and more particularly to an improved control system for an ion implanter.

Ion implanters are well known in the art. U.S. Pat. No. 4,761,559 to Myron, and assigned to the assignee herein, depicts a typical ion implanter incorporating an end station wherein semiconductor wafers are transported serially into the end station vacuum chamber, clamped to a platen, rotated into a fixed implant position, and then implanted while held rigidly in the fixed position. Typically, this fixed position is at a predetermined angle of incidence or tilt angle, generally 7° as measured between the beam and a line normal to the wafer surface, to avoid channeling effects.

There has recently been developed a need for improved versatility in ion implanter operation, specifically the ability to implant wafers at variable implant angles substantially higher than the typical 7° angle, and the ability to rotate the wafer during implantation. Some of the applications which require such versatility are large Angle Tilt Implanted Drain (LATID) transistors, trench capacitor sidewall for Dynamic Ram, Lightly Doped Drain (LDD) symmetry enhancement, channel stop trench sidewall implant, improved sheet resistance uniformity, and the reduction of shadowing effects from high aspect ratio masks. It is expected that other applications will become evident as the capability for performing these operations is incorporated in implanter designs.

Responsive to the above needs, ion implanters have been developed which include wafer support platen assemblies capable of being tilted at angles substantially greater than 7°, and capable of being rotated either continuously or in discrete steps.

With the advent of such implanter designs certain problems, which were either not evident or not significant in prior designs, have become evident when implanting at high tilt angles. More specifically, when a wafer is implanted at an angle, the beam pattern projected through a typical circular beam defining aperture is approximately elliptical at the plane of the wafer surface. As a result, a beam pattern which has a minor axis dimension great enough to cover the diameter of the wafer will have a major axis dimension which is greater than the wafer diameter. At small tilt angles the excess major axis dimension of the beam pattern is not significant; however, at large tilt angles it represents a significant area of wasted beam.

Another problem arises in the area of dosimitry. A well known method for computing the ion dose acquired by the wafer uses a Faraday Cup to collect the charge of the beam. All the charge that passes through the defining aperture is collected and measured for computing the dose. When the projection of the beam onto the wafer is substantially round and equal in area to the wafer, the amount of charge collected by the Faraday Cup divided by the area of the wafer is substantially equal to the charge per unit area (dose) that the wafer acquires as the result of the implant. At high tilt angles, however, the elliptical beam pattern does not coincide with the actual wafer area, which effectively invalidates the assumption that the charge collected by the Faraday Cup is equal to the charge acquired by the wafer.

To solve the above problems the present invention provides a variable aperture system to accommodate varying degrees of wafer tilt. More specifically, the invention provides one or more moveable defining apertures in addition to a fixed aperture, the movable apertures defining elliptical apertures of various degrees to shape the beam in relation to the degree of tilt so that an approximately circular beam pattern of substantially the same size as the wafer is projected on to the tilted wafer. This not only improves beam utilization but also permits accurate dose measurements for all practical tilt angles.

When such movable defining apertures are employed they will also affect the operation of passive electron flood rings which are incorporated in certain implanter designs. Such flood rings encircle the ion beam just upstream of the target, and are biased at a relatively low negative potential to provide secondary electrons to the target to neutralize static charge buildup. The ring is designed to intercept approximately 15° of the beam to generate the secondary electrons. When the beam pattern is corrected by the use of the elliptical aperture(s) it is possible that an insufficient position of the beam will be intercepted by the ring to provide adequate secondary electrons for charge neutralization. Accordingly, movable flood rings having elliptical apertures are provided for use in conjunction with the movable aperture(s).

Other objects and advantages of the invention will be apparent from the following description when considered in connection with the accompanying drawings, wherein.

Figure 7C:
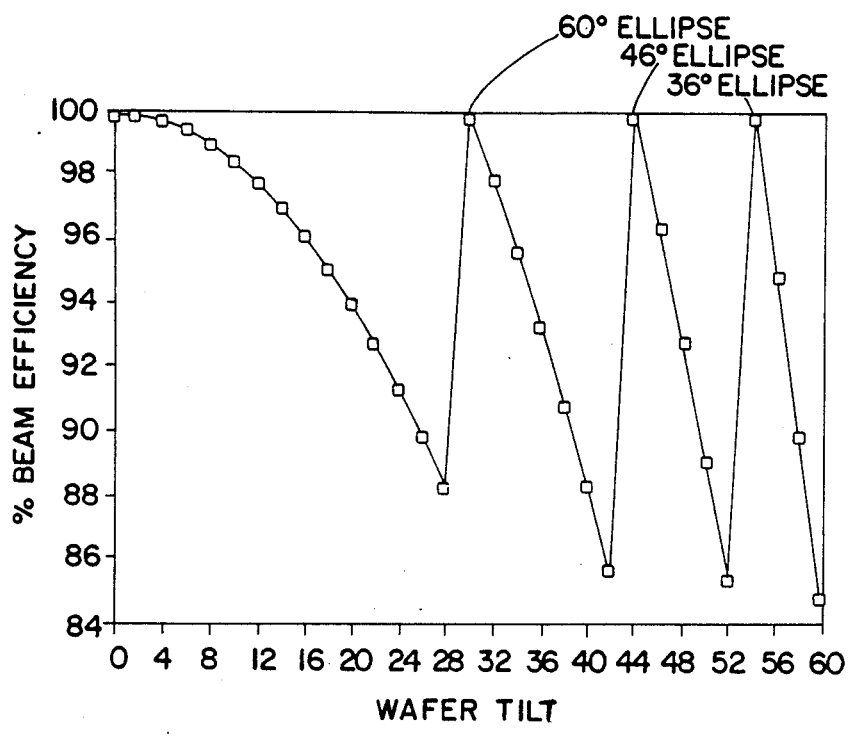
Figure 7A:
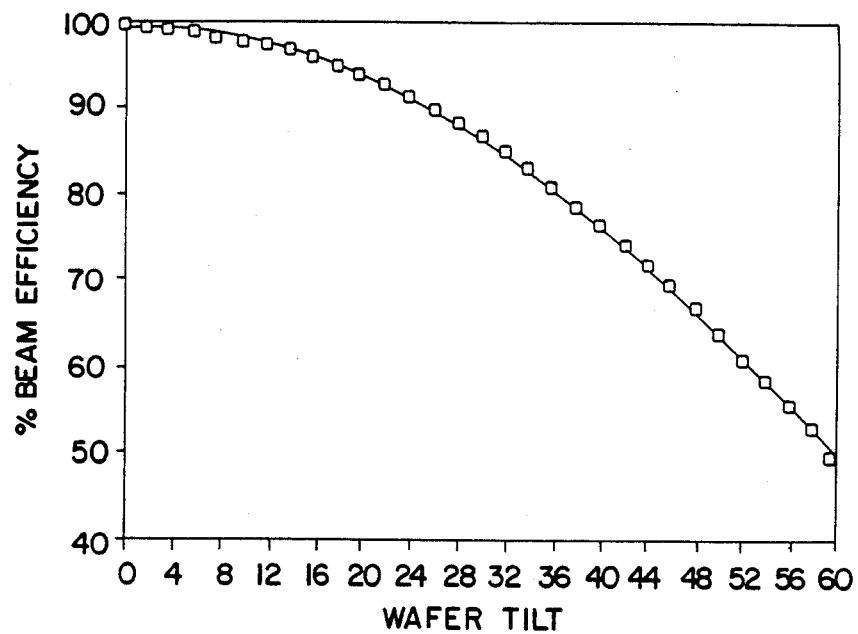
Figure 7B:
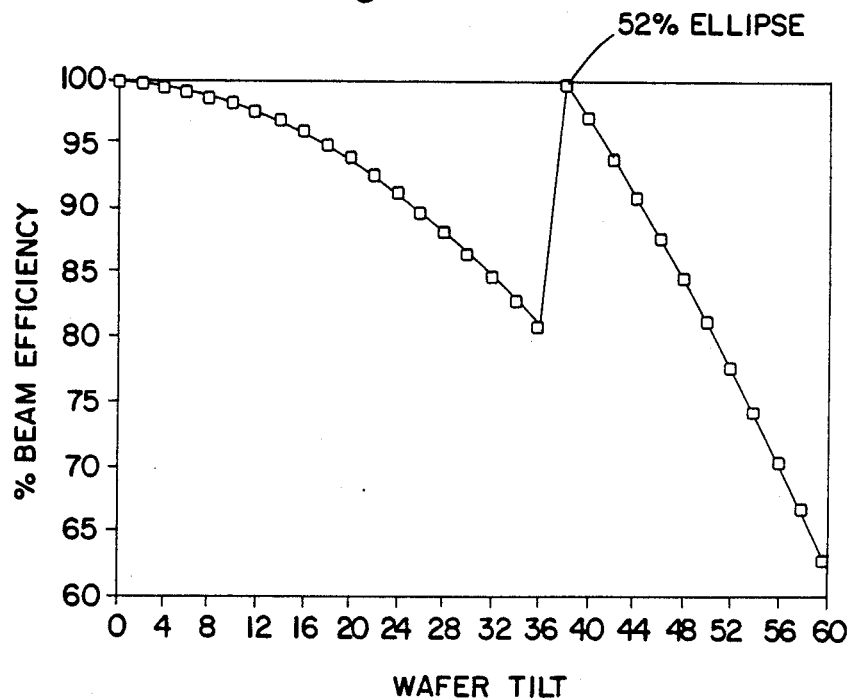

FIGS. 7A-C are graphical representations of beam efficiency vs. wafer tilt angle with and without the present invention.

Figure 1:
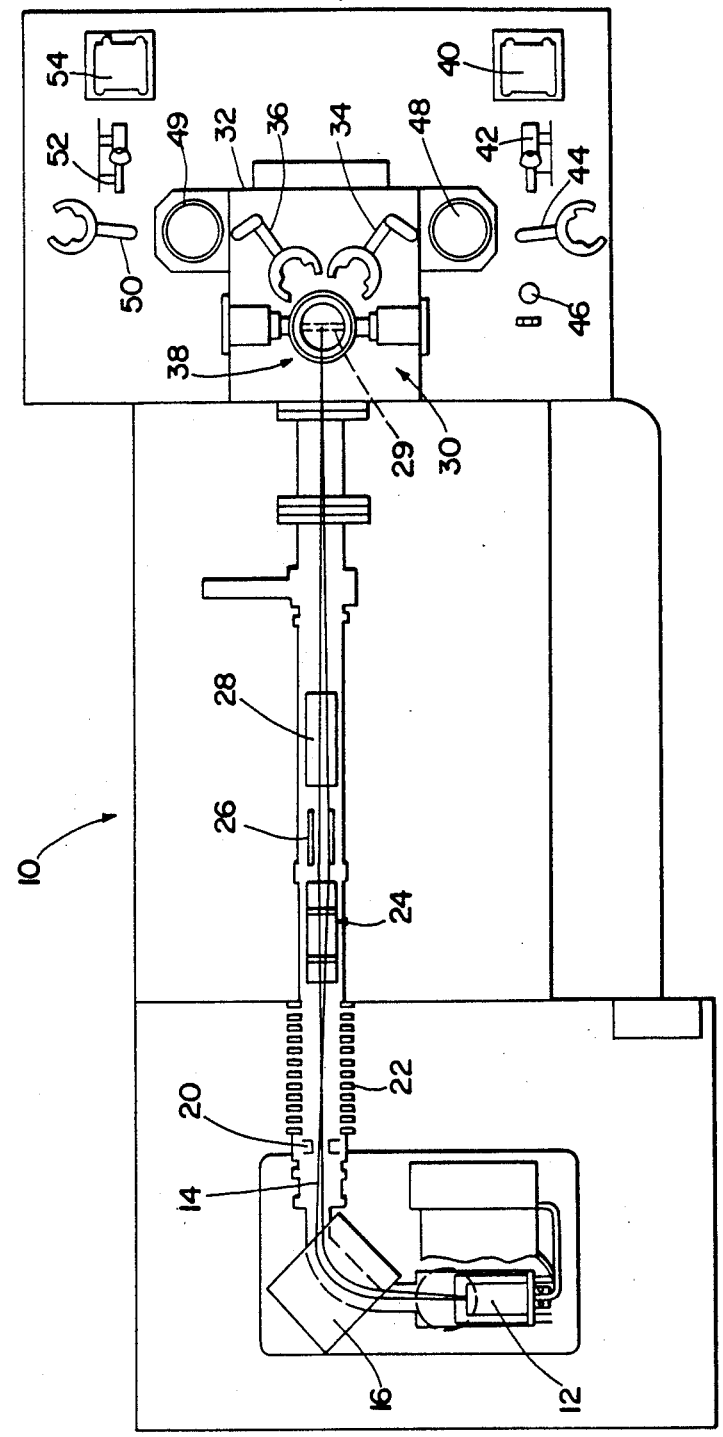
FIG. 1 is a schematic plan view of an ion implanter incorporating the invention.

Referring to FIG. 1, there is illustrated an ion implanter 10, having an ion source 12 for directing an ion beam 14 to an analyzing magnet 16 which bends the beam and directs it along an elongated travel path through a beam shutter 20 and accelerating electrodes 22. Subsequent to the electrodes 22, the beam passes through a quadrupole lens system 24 that focuses the beam, and then through deflection electrodes 26 and 28 wherein control voltages deflect the beam from side to side and up and down, the modulation of such control voltages causing the beam to be scanned across a wafer 29 positioned in an end station 30.

The end station 30 is located in an evacuated chamber 32. Two arms 34 and 36 mounted within the chamber 32 automatically load and unload wafers to and from a wafer support assembly 38. Undoped wafers are retrieved from a cassette 40 by a shuttle 42 which brings a wafer to the vicinity of an arm 44 which moves the wafer to an orienter 46, where the wafer is rotated to a particular crystal orientation. The arm 44 retrieves the oriented wafer and moves it into a loading station 48 adjacent the chamber 32. The loading station 48 closes, is pumped down to a desired vacuum, and then opens into the chamber 32. The arm 34 grasps the wafer, brings it within the chamber and places it on the support 38 in position for further handling and implantation as will be described in further detail below.

On the unload side of the chamber 32 the second arm 36 grasps an implanted wafer 29 from the support and moves it from the chamber to an unload station 49. From the unload station an arm 50 moves the wafer to a shuttle 52 which automatically places the wafer into a second cassette 54.

Figure 2:
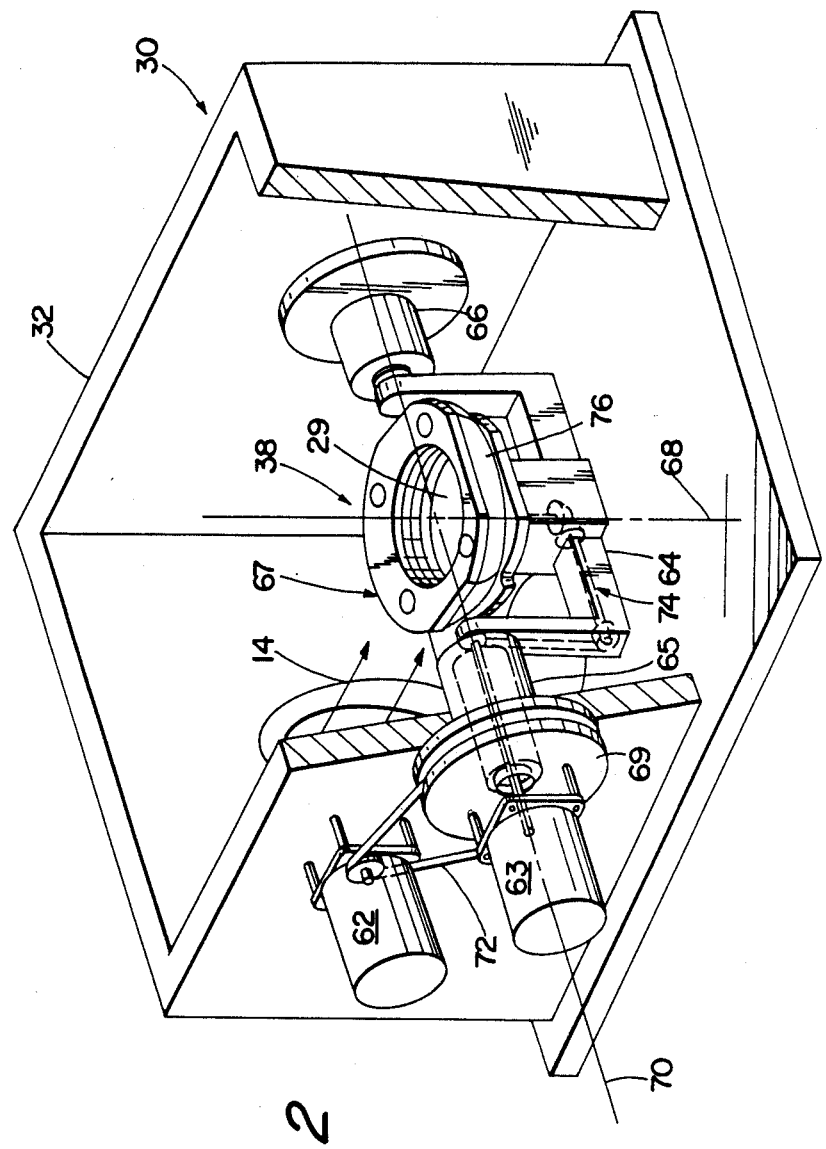
FIG. 2 is a schematic oblique view of an ion implanter target chamber including a platen assembly operable to produce high tilt angle implants.

Referring particularly to FIG. 2, the end station 30 includes a rotating and tilting wafer support assembly 38 driven by stepper motors 62 and 63 located outside the vacuum chamber.

The wafer support assembly 38 comprises a generally U-shaped housing 64 mounted for rotation in bearings 65 and 66 fixed to the side walls of the vacuum chamber 32, and a platen assembly 67 mounted on the housing 64 for rotation about an axis 68. A large sheave 69 is fixed to a portion of the housing 64 which extends through the bearing 65 and is driven about an axis 70 by motor 62 through a belt 72. Motor 63 is mounted on the sheave 69, and drives the platen assembly 67 about axis 68 through a drive system 74 enclosed within housing 64 but not connected thereto.

The platen assembly 67 includes a wafer clamp 76 which holds a wafer 29 in contact with a platen (not shown).

Figure 4:
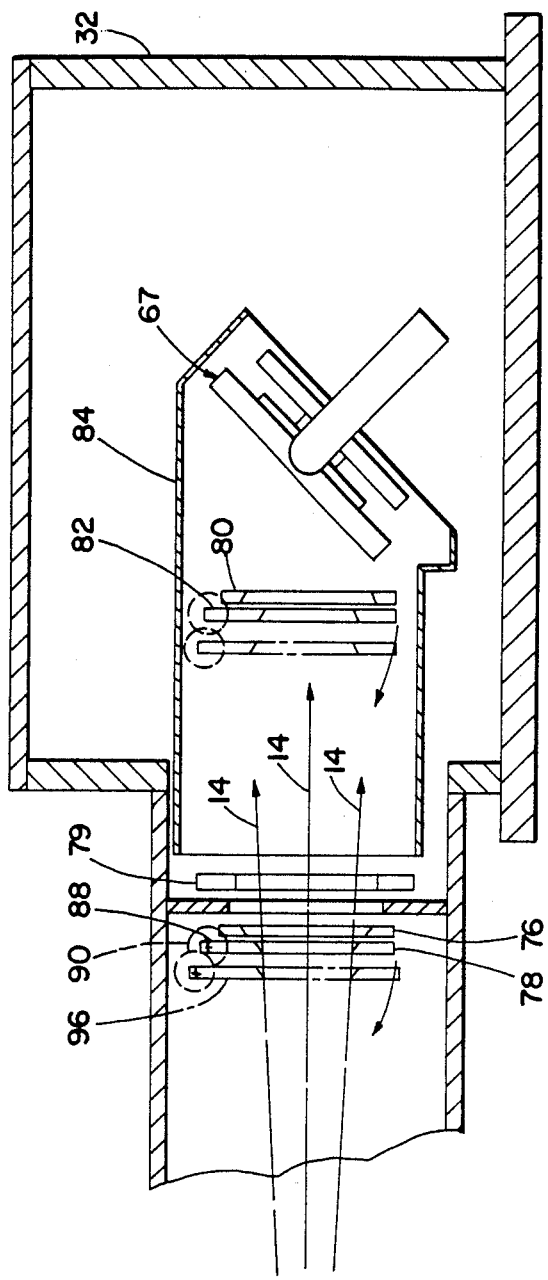
FIG. 4 is a sectional view of the end station of FIG. 2 incorporating the invention.

As shown in FIG. 2 the platen assembly is shown in its horizontal position for receiving wafers transferred into the vacuum chamber from the loading station 48 and for transferring implanted wafers to the unload station 49. In FIG. 4, the platen assembly is shown in position for performing a high tilt angle (e.g., 45°) implant.

Figure 3:
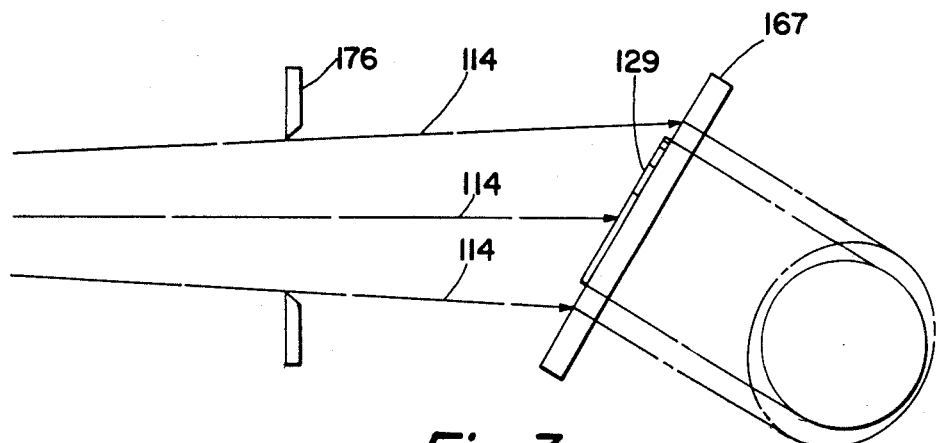
FIG. 3 is a schematic representation of a prior art beam line and target relationship.

FIG. 3 illustrates the effect of a high implant angle on the beam pattern of an implanter whose beamline is configured in accordance with prior art practice. The beam 114 projected through an aperture plate 176 having a circular aperture formed therein defines an approximately elliptical pattern at the plane of the wafer surface, producing an excess beam area represented by the difference between the major axis of the ellipse and the diameter of the wafer. As discussed above, this results not only in inefficient beam utilization but also introduces errors in dose measurement.

FIG. 4 is a schematic representation of the beamline end of the end station 30, wherein the beam 14 enters the vacuum chamber 32 and impinges on a wafer 29 held at a high tilt angle by the platen assembly 67. The beamline components include a fixed defining aperture plate 76, a movable defining aperture plate 78 upstream of the fixed aperture plate, an electron suppressor ring electrode 79, a fixed secondary electron flood ring 80, a movable flood ring 82, the platen assembly 67, and a Faraday Cup 84 encircling the components downstream of the suppressor electrode.

Figure 5:
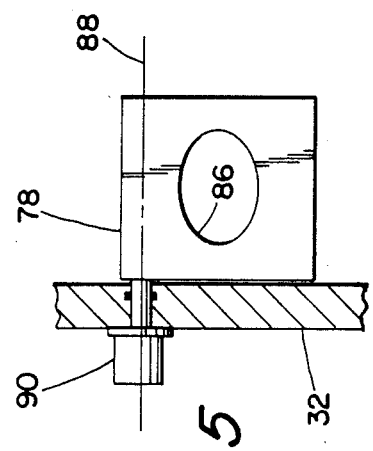
FIG. 5 is a front view of a movable aperture plate of the invention.

The fixed aperture plate 76 is of well known construction having a circular opening adapted for zero angle or low angle implants. The movable aperture plate 78 has an elliptical aperture 86 as shown in FIG. 5 and is mounted for pivotal movement about an axis 88 so that it can be retracted to an out-of-the-way position when not in use. When implanting at low tilt angles, i.e. low angles between the beam and a line normal to the wafer surface, the movable aperture is pivoted about axis 88 to a position out of the path of beam 14 so that only the fixed aperture is effective to define an approximately circular beam pattern impinging on the wafer.

Referring to FIG. 5, the aperture plate 78 is actuated by a motor 90 mounted outside the vacuum chamber and having an output shaft attached to the aperture plate 78 on axis 88.

Figure 6:
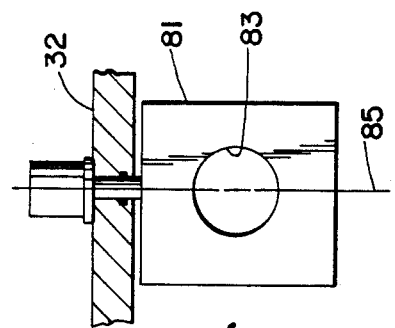
FIG. 6 is a front view of an alternative embodiment of the aperture plate.

FIG. 6 illustrates an alternative embodiment wherein a moveable aperture plate 81 includes a circular aperture 83, and is pivotable about a vertical central axis 85. Using this configuration, when the plate is positioned at an angle to the beam an elliptical beam pattern is produced which will result in an approximately circular beam pattern at the surface of the tilted wafer. By varying the angle of the plate, approximately elliptical patterns of varying degrees of ellipticity can be produced.

Referring again to FIG. 5, the aperture 86 could also be formed using multiple elements which define an iris thus defining an aperture of essentially infinitely variable ellipticity.

The graph shown in FIG. 7A depicts a computer simulation illustrating the effect of using a circular defining aperture in a high tilt implant (see FIG. 3), wherein as the tilt angle is increased, more and more beam is wasted. More specifically, at a tilt angle of 45° approximately 30% of the beam falls outside the wafer, while at 60° tilt angle approximately 50% of the beam falls outside.

If movable aperture plate 78 has an elliptical aperture 86 as illustrated in FIG. 5, having a degree of ellipticity which is complementary to the tilt angle of the wafer, and with the major axis of the ellipse approximately equal to the diameter of the circular aperture in the fixed aperture plate and a minor axis smaller than the diameter of the circular aperture, the beam pattern projected onto the wafer surface will be substantially circular and substantially the same size as the wafer and will result in essentially 100% beam utilization.

In situations wherein the wafer tilt angle does not complement the ellipticity of the aperture 86, the present invention can still produce significant improvement in beam utilization over that illustrated in FIG. 7A. The graph shown in FIG. 7B depicts results which would be obtained using the configuration of FIG. 4 wherein the aperture of fixed aperture plate 76 is circular and the aperture 86 of movable aperture plate 78 defines, for example, a 52° ellipse, and wherein only the fixed aperture is used for tilt angles less than 38°, while the movable aperture is put into position for tilt angles 38° and greater. It can be seen that at just below 38° the beam efficiency has only dropped to 80%, and as can be expected goes to 100% at 38°. At angles higher than 38° there is still a significant improvement in efficiency at least through 50° where it again falls to 80% (compared to approximately 65% at 50° with just a circular aperture).

It can be appreciated from the above that further improvements in efficiency can be realized if additional movable aperture plates such as aperture plates 96 shown in broken line are added to the FIG. 4 configuration, each defining a different ellipse. For example, the graph in FIG. 7C depicts the result of using multiple moveable apertures plates having 60°, 46° and 36° elliptical openings, resulting in no efficiency lower than 85% at any tilt angle up to 60°.

Referring to FIG. 4, the secondary electron flood ring 80 depends on the interception of a certain percentage of the ion beam to produce sufficient secondary electrons to flood the wafer with neutralizing electrons. Use of the moveable aperture plate 78, with its elliptical aperture 86, could result in insufficient overscan and adversely affect the performance of the flood ring. Accordingly, movable flood ring 82 is provided having an elliptical aperture formed at the same angle as the aperture in moveable aperture plate 78. The major axis of the ellipse is equal to the diameter of the circular aperture in the stationary flood ring 80 and the minor axis is sized to have same major to minor axis ratios as the ellipse 86 in aperture 78. If multiple defining apertures are used as, then corresponding additional flood rings can be provided as illustrated in broken line.

We claim:

1. In an ion implanter comprising a vacuum chamber, wafer-receiving support means within said vacuum chamber, means for directing an ion beam onto a wafer received on said support means, and a first aperture plate having a beam defining aperture formed therein positioned to intercept the beam upstream of said support means; the improvement wherein the aperture formed in said aperture plate is elliptical.

2. Apparatus as claimed in claim 1, including means for tilting said support means about an axis perpendicular to the axis of the ion beam, said elliptical aperture having its major axis oriented parallel to the tilt axis of said support means.

3. Apparatus as claimed in claim 1, in which said aperture plate is moveable between a first position in the path of said ion beam and a second position out of the path of said ion beam.

4. Apparatus as claimed in claim 1, including a second aperture plate disposed downstream of said first aperture plate, said second aperture plate being mounted in fixed position with respect to the beam and having a circular aperture formed therein.

5. Apparatus as claimed in claim 1 including one or more additional aperture plates positioned to intercept the beam upstream of said first aperture plate, each of said additional aperture plates having an elliptical aperture formed therein of different degree of ellipticity from those in the other additional aperture plates and from the aperture in said first aperture plate.

6. Apparatus as claimed in claim 6, in which each of said additional aperture plates is movable between a first position in the path of said ion beam and a second position out of the path of said ion beam.

7. In an ion implanter comprising a vacuum chamber, wafer-receiving support means within said vacuum chamber, means for directing an ion beam onto a wafer received on said support means, and means defining a beam-defining aperture positioned to intercept the beam upstream of said support means; the improvement wherein said means defining said beam defining aperture comprises means defining elliptical apertures of varying degrees of ellipticity.

8. Apparatus as claimed in claim 7, in which said means defining elliptical apertures comprises a plurality of aperture plates disposed in the path of said ion beam, each of said aperture plates having an elliptical aperture of a different degree of ellipticity from the others.

9. In an ion implanter comprising a vacuum chamber, wafer-receiving support means within said vacuum chamber, means for directing an ion beam onto a wafer received on said support means, and an aperture plate having a circular beam defining aperture formed therein; the improvement comprising means for rotating said aperture plate about an axis through a diameter of said circular aperture.

10. Apparatus as claimed in claim 9, including means for tilting said support means about an axis perpendicular to the axis of the ion beam, the axis of rotation of said aperture plate being perpendicular to the tilt axis of said support means.

11. Apparatus as claimed in any one of claims 1 through 10 including one or more rings operable to emit secondary electrons encircling the beam between said defining aperture and said support means, each of said one or more rings having an elliptical aperture formed therein.

12. Apparatus as claimed in claim 11, in which each of said one or more rings is movable between a first position in the path of the beam and a second position out of the path of the beam.

* * * * *